(12) United States Patent
Kim

(10) Patent No.: US 9,013,935 B2
(45) Date of Patent: Apr. 21, 2015

(54) DATA INPUT CIRCUITS

(71) Applicant: SK Hynix Inc., Icheon-si Gyeonggi-do (KR)

(72) Inventor: Min Chang Kim, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 116 days.

(21) Appl. No.: 13/845,203

(22) Filed: Mar. 18, 2013

(65) Prior Publication Data

US 2014/0056087 A1  Feb. 27, 2014

(30) Foreign Application Priority Data

Aug. 24, 2012  (KR) .................. 10-2012-0092966

(51) Int. Cl.
*G11C 7/00* (2006.01)
*G11C 7/22* (2006.01)
*G11C 7/10* (2006.01)
*G11C 29/12* (2006.01)

(52) U.S. Cl.
CPC .............. *G11C 7/222* (2013.01); *G11C 7/1087* (2013.01); *G11C 7/1093* (2013.01); *G11C 7/1096* (2013.01); *G11C 29/12015* (2013.01); *G11C 2207/2272* (2013.01)

(58) Field of Classification Search
CPC ....... G11C 7/22; G11C 7/222; G11C 11/4076

USPC .......................... 365/194, 201, 233
See application file for complete search history.

(56) References Cited

U.S. PATENT DOCUMENTS

| 4,733,167 | A  | * | 3/1988 | Tamamura ................ 341/120 |
| 7,126,511 | B2 | * | 10/2006 | Draxelmayr et al. ......... 341/136 |
| 7,184,340 | B2 | * | 2/2007 | Lim .................. 365/201 |
| 7,412,616 | B2 | * | 8/2008 | Matsui et al. ............... 713/401 |
| 7,567,073 | B2 | * | 7/2009 | Hori .................. 324/76.54 |

FOREIGN PATENT DOCUMENTS

| KR | 1020110060513 A | 6/2011 |
| KR | 1020110134634 A | 12/2011 |

* cited by examiner

*Primary Examiner* — Connie Yoha
(74) *Attorney, Agent, or Firm* — William Park & Associates Ltd.

(57) ABSTRACT

Data input circuits are provided. The data input circuit includes a drive clock signal generator, a data transmitter and a write driver. The drive clock signal generator is configured to shift and delay a final clock signal generated in response to a pulse of a sampled clock signal and configured to generate a drive clock signal in response to the delayed final clock signal. The data transmitter is configured to output input data signals as write input data signals in response to the drive clock signal. The write driver is configured to receive the write input data signals in response to the drive clock signal to drive signals on global lines.

28 Claims, 7 Drawing Sheets

DATA INPUT CIRCUITS

CROSS-REFERENCE TO RELATED APPLICATION

The present application claims priority under 35 U.S.C 119(a) to Korean Application No. 10-2012-0092966, filed on Aug. 24, 2012, in the Korean Intellectual Property Office, which is incorporated herein by reference in its entirety as set forth in full.

BACKGROUND

Semiconductor memory devices have been continuously developed to improve the operation speed thereof with increase of their integration density. For example, synchronous memory devices operating in synchronization with clock signals have been revealed to improve the operation speed thereof.

Single data rate (SDR) synchronous memory devices have been first proposed to enhance the operation speed of the semiconductor memory devices. The SDR synchronous memory devices receive or output the data in synchronization with every rising edge of an external clock signal. However, high performance memory devices, which are faster than the SDR synchronous memory devices, are still required to meet the requirements of high performance electronic systems. Accordingly, double data rate (DDR) synchronous memory devices operating at a higher speed than the SDR synchronous memory devices have been proposed recently. The DDR synchronous memory devices may receive or output the data twice during a single period of an external clock signal. That is, the DDR synchronous memory devices may receive or output the data in synchronization with every rising edge and every falling edge of the external clock signal. Thus, the DDR synchronous memory devices may operate at a speed which is twice as higher than that of the SDR synchronous memory devices even without an increase in the frequency of an external clock signal.

Meanwhile, the DDR synchronous memory devices use a multi-bit pre-fetch scheme that internally processes multi-bit data at a single time. According to the multi-bit pre-fetch scheme, multi-bit data serially inputted may be arranged in parallel in synchronization with a data strobe signal, and the multi-bit data arranged in parallel may be simultaneously stored in memory cells by a write command signal. Specifically, the multi-bit data arranged in parallel may be transmitted to a write driver by a data input clock signal and the data transmitted to the write driver may be finally stored into the memory cells through global lines at a single time by an enable signal.

SUMMARY

Various embodiments are directed to data input circuits.

According to various embodiments, a data input circuit includes a drive clock signal generator, a data transmitter and a write driver. The drive clock signal generator is configured to shift and delay a final clock signal generated in response to a pulse of a sampled clock signal and configured to generate a drive clock signal in response to the delayed final clock signal. The data transmitter is configured to output input data signals as write input data signals in response to the drive clock signal. The write driver is configured to receive the write input data signals in response to the drive clock signal to drive signals on global lines.

According to further embodiments, a data input circuit includes a data strobe signal sensing circuit and a drive clock signal generator. The data strobe signal sensing circuit is configured to generate a shifting signal and a sampled clock signal in response to a write command signal, first to fourth write latency signals and burst signals. Further, the data strobe signal sensing circuit is configured to generate a final clock signal in synchronization with the sampled clock signal and configured to latch an internal strobe signal while the final clock signal is enabled to generate a write latch signal. The drive clock signal generator is configured to shift and delay the final clock signal and configured to generate a drive clock signal in response to the delayed final clock signal.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Various embodiments of the inventive concept will be described hereinafter with reference to the accompanying drawings.

However, the various embodiments described herein are for illustrative purposes only and are not intended to limit the scope of the inventive concept.

Figure 1:
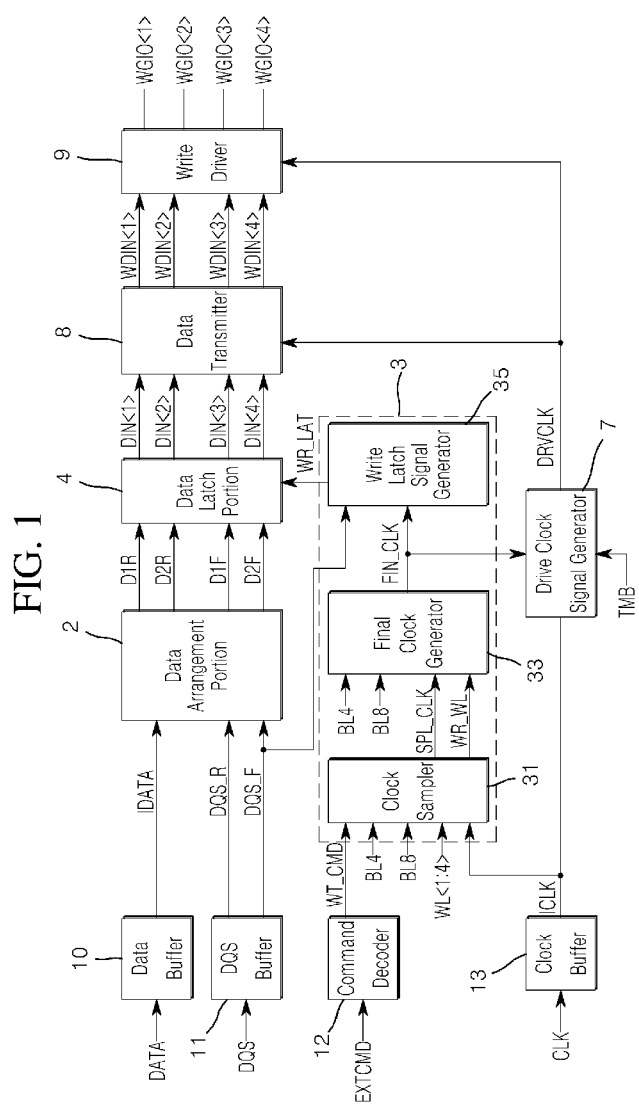
FIG. 1 is a block diagram illustrating a configuration of a data input circuit according to various embodiments.

FIG. 1 is a block diagram illustrating a configuration of a data input circuit according to various embodiments.

As illustrated in FIG. 1, a data input circuit according to an embodiment may be configured to include a data buffer 10, a data strobe signal (DQS) buffer 11, a command decoder 12, a clock buffer 13, a data arrangement portion 2, a data strobe signal sensing circuit 3, a data latch portion 4, a drive clock signal generator 7, a data transmitter 8 and a write driver 9.

The data buffer 10 may buffer a data signal DATA to generate an internal data signal IDATA. The DQS buffer 11 may receive and buffer a data strobe signal DQS to generate a first internal strobe signal DQS_R and a second internal strobe signal DQS_F. The first internal strobe signal DQS_R may be generated in synchronization with a rising edge of the data strobe signal DQS, and the second internal strobe signal DQS_F may be generated in synchronization with a falling edge of the data strobe signal DQS. The command decoder 12 may decode an external command signal EXTCMD to generate a write command signal WT_CMD for a write operation. The clock buffer 13 may buffer a clock signal CLK to generate an internal clock signal ICLK.

The data arrangement portion 2 may arrange data of the internal data signal IDATA in synchronization with the first and second internal strobe signals DQS_R and DQS_F to generate a first rising data signal D1R, a second rising data signal D2R, a first falling data signal D1F and a second falling data signal D2F.

The data strobe signal sensing circuit 3 may be configured to include a clock sampler 31, a final clock generator 33 and a write latch signal generator 35. The clock sampler 31 may receive the write command signal WT_CMD, a first burst signal BL4, a second burst signal BL8 and first to fourth write latency signals WL<1:4> and may generate a shifting signal WR_WL including a pulse that occurs after a write latency. Further, the clock sampler 31 may select and sample the internal clock signal ICLK during a burst length from a point of time that the pulse of the shifting signal WR_WL occurs, thereby outputting the selected internal clock signal ICLK as a sampled clock signal SPL_CLK. The final clock generator 33 may latch the shifting signal WR_WL in synchronization with the sampled clock signal SPL_CLK and may generate a final clock signal FIN_CLK in response to the first and second burst signals BL4 and BL8. The write latch signal generator 35 may latch a last pulse of the second internal strobe signal DQS_F to generate a write latch signal WR_LAT, in response to the final clock signal FIN_CLK. Further detailed configurations and operations of the clock sampler 31 and the final clock generator 33 will be described with reference to FIGS. 2, 3 and 4 later.

The data latch portion 4 may latch the first rising data signal D1R, the second rising data signal D2R, the first falling data signal D1F and the second falling data signal D2F in synchronization with a rising edge of the write latch signal WR_LAT, thereby outputting first to fourth input data signals DIN<1:4>.

The drive clock signal generator 7 may generate a drive clock signal DRVCLK which is enabled for a duration determined according to a test signal TMB. Further detailed configurations and operations of the drive clock signal generator 7 will be described with reference to FIG. 5 later. The test signal TMB may be enabled to have a logic "low" level for a test execution that increases operating durations of the data transmitter 8 and the write driver 9.

The data transmitter 8 may output the first to fourth input data signals DIN<1:4> as first to fourth write input data signals WDIN<1:4> in synchronization with the drive clock signal DRVCLK. The write driver 9 may receive the first to fourth write input data signals WDIN<1:4> in synchronization with the drive clock signal DRVCLK to drive signal levels on first to fourth global lines WGIO<1:4>. Further detailed configurations and operations of the data transmitter 8 and the write driver 9 will be described with reference to FIG. 6 later.

Figure 2:
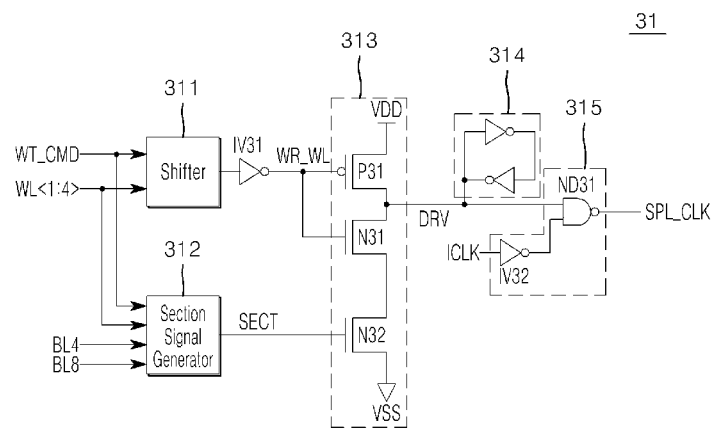
FIG. 2 is a circuit diagram illustrating an example of a clock sampler included in the data input circuit of FIG. 1.

FIG. 2 is a circuit diagram illustrating an example of the clock sampler included in the data input circuit of FIG. 1.

As illustrated in FIG. 2, the clock sampler 31 may be configured to include a shifter 311, an inverter IV31, a section signal generator 312, a driver 313, a latch portion 314 and a transmitter 315. The shifter 311 may shift the write command signal WT_CMD by a write latency which is set by the first to fourth write latency signals WL<1:4> and may output the shifted write command signal WT_CMD. The inverter IV31 may inversely buffer an output signal of the shifter 311 to generate and output the shifting signal WR_WL. The section signal generator 312 may generate a section signal SECT which is disabled to have a logic "low" level during the write latency determined by the first to fourth write latency signals WL<1:4> and the burst length determined by the first and second burst signals BL4 and BL8 after a point of time that the write command signal WT_CMD is inputted. The driver 313 may be configured to include a PMOS transistor P31 and NMOS transistors N31 and N32 which are serially connected between a power supply voltage VDD and a ground voltage VSS. The driver 313 may output a drive signal DRV in response to the shifting signal WR_WL and the section signal SECT. The latch portion 314 may latch the drive signal DRV.

The transmitter 315 may configured to include an inverter IV32 and a NAND gate ND31. The transmitter 315 may output the internal clock signal ICLK as the sampled clock signal SPL_CLK during a period that the drive signal DRV has a logic "high" level. If the first write latency signal WL<1> has a logic "high" level, the write latency may be set to have one. Thus, data for a write operation may be inputted after one cycle of the internal clock signal ICLK from a point of time that the write command signal WT_CMD is inputted. Further, if the second write latency signal WL<2> has a logic "high" level, the write latency may be set to have two. Thus, data for a write operation may be inputted after two cycles of the internal clock signal ICLK from a point of time that the write command signal WT_CMD is inputted. Additionally, if the first burst signal BL4 has a logic "high" level, the burst length that the data are serially inputted may be set to have four cycles of the internal clock signal ICLK. Further, if the second burst signal BL8 has a logic "high" level, the burst length that the data are serially inputted may be set to have eight cycles of the internal clock signal ICLK.

As described above, the clock sampler 31 may select and sample the internal clock signal ICLK during the burst length after the write latency to output the sampled internal clock signal ICLK as the sampled clock signal SPL_CLK. For example, if the write latency is set to have one and the first burst signal BL4 has a logic "high" level, the internal clock signal ICLK may be selected and sampled during four cycles of the internal clock signal ICLK after one cycle of the internal clock signal ICLK elapses from a point of time that the write command signal WT_CMD is inputted, and the sampled internal clock signal ICLK may be outputted as the sampled clock signal SPL_CLK corresponding to an output signal of the clock sampler 31.

Figure 3:
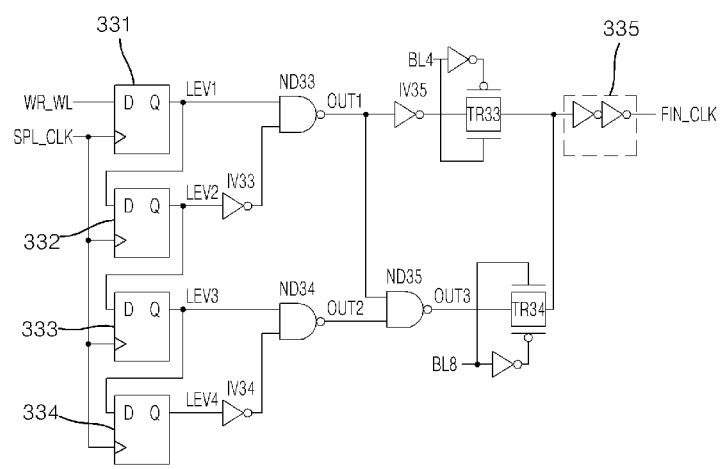
FIG. 3 is a circuit diagram illustrating an example of a final clock generator included in the data input circuit of FIG. 1.
Figure 4:
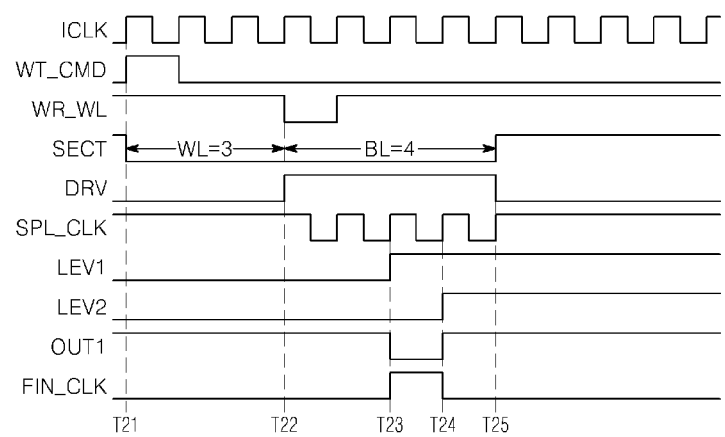
FIG. 4 is a timing diagram illustrating an operation of the final clock generator shown in FIG. 3.

FIG. 3 is a circuit diagram illustrating an example of the final clock generator included in the data input circuit of FIG. 1, and FIG. 4 is a timing diagram illustrating an operation of the final clock generator shown in FIG. 3.

As illustrated in FIG. 3, the final clock generator 33 may be configured to include first to fourth level signal generators 331, 332, 333 and 334, a plurality of inverters IV33, IV34 and IV35, a plurality of NAND gates ND33, ND34 and ND35, a plurality of transfer gates TR33 and TR34, and a buffer 335. The first level signal generator 331 may latch the shifting signal WR_WL in synchronization with the sampled clock signal SPL_CLK to generate a first level signal LEV1. The second level signal generator 332 may latch the first level signal LEV1 in synchronization with the sampled clock signal SPL_CLK to generate a second level signal LEV2. The third level signal generator 333 may latch the second level signal LEV2 in synchronization with the sampled clock signal SPL_CLK to generate a third level signal LEV3. The fourth level signal generator 334 may latch the third level signal LEV3 in synchronization with the sampled clock signal SPL_CLK to generate a fourth level signal LEV4.

The inverter IV33 may invert the second level signal LEV2 and may output the inverted signal of the second level signal LEV2. The NAND gate ND33 may execute a NAND operation of the first level signal LEV1 and an output signal of the inverter IV33 to generate a first output signal OUT1. The inverter IV34 may invert the fourth level signal LEV4 and may output the inverted signal of the fourth level signal LEV4. The NAND gate ND34 may execute a NAND operation of the third level signal LEV3 and an output signal of the inverter IV34 to generate a second output signal OUT2. The NAND gate ND35 may execute a NAND operation of the first and second output signals OUT1 and OUT2 to generate a third output signal OUT3. The inverter IV35 may invert the first output signal OUT1 and may output the inverted signal of the first output signal OUT1. The transfer gate TR33 may transfer an output signal of the inverter IV35 to the buffer 335 when the first burst signal BL4 has a logic "high" level. The transfer gate TR34 may transfer an output signal of the NAND gate ND35 to the buffer 335 when the second burst signal BL8 has a logic "high" level. The buffer 335 may buffer the output signal of the transfer gate TR33 or TR34 to generate the final clock signal FIN_CLK. Each of the first to fourth level signal generators 331, 332, 333 and 334 may be realized using a D flip-flop.

An operation of the final clock generator 33 illustrated in FIG. 3 will be described with reference to FIG. 4. For the purpose of ease and convenience in explanation, it is assumed that the third write latency signal WL<3> has a logic "high" level and the first burst signal BL4 has a logic "high" level (i.e., WL=3 and BL=4, shown at section signal SECT).

If the write command signal WT_CMD is generated at a point of time T21, a pulse of the shifting signal WR_WL may be generated at a point of time T22 that three cycles of the internal clock signal ICLK elapses from the point of time T21, and the internal clock signal ICLK may be selected and sampled from the point of time T22 till a point of time T25 that the burst length corresponding to four cycles of the internal clock signal ICLK terminates and the sampled internal clock signal ICLK may be outputted as the sampled clock signal SPL_CLK. The section signal SECT have a logic "low" level from the point of time T21 till a point of time T25, and the drive signal DRV have a logic "high" level from the point of time T22 till a point of time T25.

When the first burst signal BL4 has a logic "high" level, the final clock signal FIN_CLK may be a signal that the first output signal OUT1 generated according to a level combination of the first and second level signals LEV1 and LEV2 is inversely buffered. The first level signal LEV1 may be changed from a logic "low" level to a logic "high" level in synchronization with a point of time T23 that a first rising pulse of the sampled clock signal SPL_CLK is generated after the pulse of the shifting signal WR_WL is inputted. Further, the second level signal LEV2 may be changed from a logic "low" level to a logic "high" level in synchronization with a point of time T24 that a second rising pulse of the sampled clock signal SPL_CLK is generated after the pulse of the shifting signal WR_WL is inputted. The first output signal OUT1 may be generated to have a logic "low" level from the point of time T23 that the level transition of the first level signal LEV1 occurs till the point of time T24 that the level transition of the second level signal LEV2 occurs. Thus, the final clock signal FIN_CLK may be generated to have a logic "high" level from the point of time T23 till the point of time T24.

Figure 5:
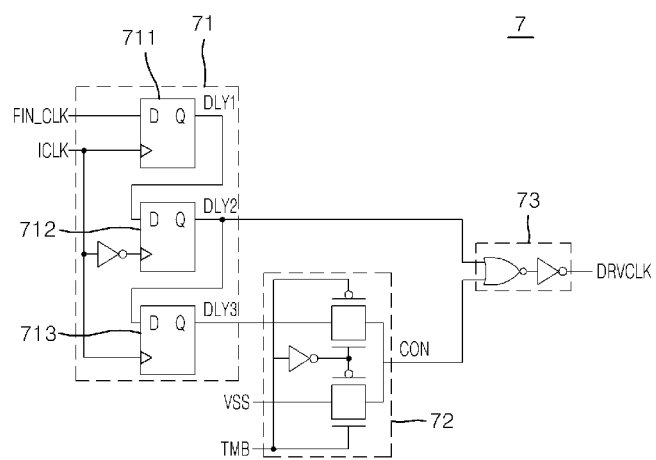
FIG. 5 is a circuit diagram illustrating an example of a drive clock signal generator included in the data input circuit of FIG. 1.

FIG. 5 is a circuit diagram illustrating an example of the drive clock signal generator included in the data input circuit of FIG. 1.

As illustrated in FIG. 5, the drive clock signal generator 7 may be configured to include a delay unit 71, a selection transmitter 72 and a combinational logic unit 73. The delay unit 71 may include a first delay signal generator 711, a second delay signal generator 712 and a third delay signal generator 713. The first delay signal generator 711 may latch the final clock signal FIN_CLK in synchronization with the internal clock signal ICLK to generate a first delay signal DLY1. The second delay signal generator 712 may latch the first delay signal DLY1 in synchronization with an inverted signal of the internal clock signal ICLK to generate a second delay signal DLY2. The third delay signal generator 713 may latch the second delay signal DLY2 in synchronization with the internal clock signal ICLK to generate a third delay signal DLY3. The selection transmitter 72 may receive a ground voltage signal VSS to output the ground voltage signal VSS as a control signal CON when the test signal TMB has a logic "high" level and may receive the third delay signal DLY3 to output the third delay signal DLY3 as the control signal CON when the test signal TMB has a logic "low" level. The control signal CON may be transferred to the combinational logic unit 73. The combinational logic unit 73 may generate the drive clock signal DRVCLK having a logic "high" level when at least one of the second delay signal DLY2 and the control signal CON has a logic "high" level. The second delay signal DLY2 may be a signal which is obtained by shifting the first delay signal DLY1 by half a cycle of the internal clock signal ICLK, and the third delay signal DLY3 may be a signal which is obtained by shifting the second delay signal DLY2 by half a cycle of the internal clock signal ICLK.

As described above, the drive clock signal generator 7 may generate the drive clock signal DRVCLK whose enabled duration is controlled according to the test signal TMB. When the test signal TMB has a logic "high" level out of a test mode, the second delay signal DLY2 may be buffered to generate the drive clock signal DRVCLK. Thus, the drive clock signal DRVCLK may be enabled for one cycle of the internal clock signal ICLK. Alternatively, when the test signal TMB has a logic "low" level under the test mode, the drive clock signal DRVCLK may be enabled to have a logic "high" level if at least one of the second and third delay signals DLY2 and DLY3 has a logic "high" level. Thus, the drive clock signal DRVCLK may be enabled for 1.5 times the cycle of the internal clock signal ICLK in the test mode.

Figure 6:
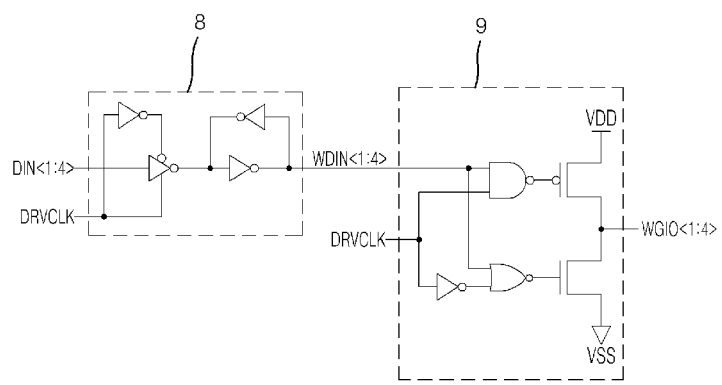
FIG. 6 is a circuit diagram illustrating examples of a data transmitter and a write driver included in the data input circuit of FIG. 1.

FIG. 6 is a circuit diagram illustrating examples of the data transmitter and the write driver included in the data input circuit of FIG. 1.

As illustrated in FIG. 6, while the drive clock signal DRVCLK is enabled to have a logic "high" level, the data transmitter 8 may receive the first to fourth input data signals DIN<1:4> and may output the first to fourth input data signals DIN<1:4> as the first to fourth write input data signals WDIN<1:4>. The write driver 9 may receive the first to fourth write input data signals WDIN<1:4>, ground voltage VSS and power supply voltage VDD to drive signal levels on the first to fourth global lines WGIO<1:4> while the drive clock signal DRVCLK is enabled to have a logic "high" level.

Accordingly, the data transmitter 8 and the write driver 9 may operate for one cycle of the internal clock signal ICLK out of the test mode and may operate for 1.5 times the cycle of the internal clock signal ICLK under the test mode.

Figure 7:
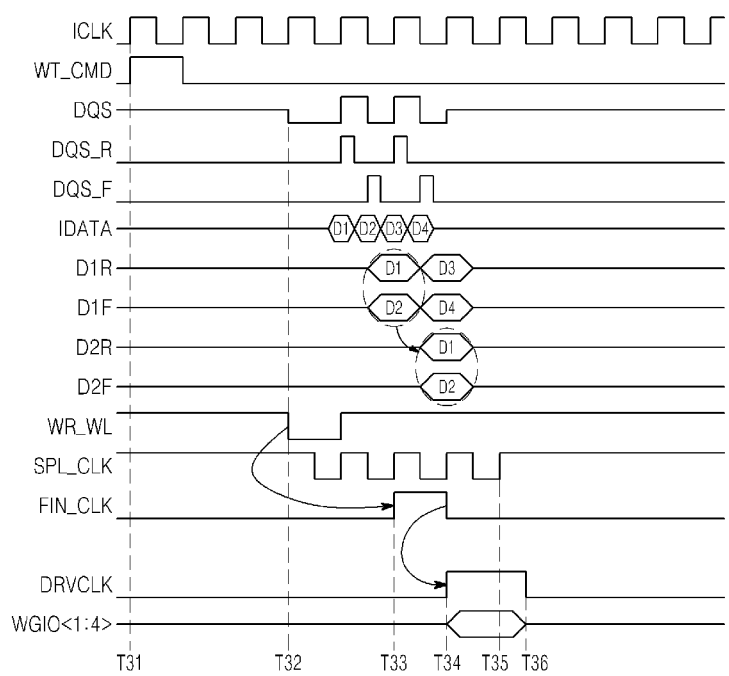
FIG. 7 is a timing diagram illustrating an operation of the data input circuit shown in FIG. 1.

An operation of the data input circuit set forth above will be described hereinafter with reference to FIG. 7. For the purpose of ease and convenience in explanation, it is assumed that the write latency is 'three' and the first burst signal BL4 has a logic "high" level. Further, it is assumed that the data input circuit is under the test mode.

First, if the write command signal WT_CMD is generated at a point of time T31, the internal data signal IDATA may be arranged into the first rising data signal D1R, the second rising data signal D2R, the first falling data signal D1F and a second falling data signal D2F in synchronization with the first and second internal strobe signals DQS_R and DQS_F which are generated from the data strobe signal DQS (i.e., D1, D2, D3, and D4).

Next, a pulse of the shifting signal WR_WL may be generated at a point of time T32 that three cycles of the internal clock signal ICLK elapses from the point of time T31 that the write command signal WT_CMD is generated, and the internal clock signal ICLK may be selected and sampled from the point of time T32 till a point of time T35 that the burst length corresponding to four cycles of the internal clock signal ICLK terminates and the sampled internal clock signal ICLK may be outputted as the sampled clock signal SPL_CLK. The final clock signal FIN_CLK may be enabled from a point of time that a first rising pulse of the sampled clock signal SPL_CLK is generated after the pulse of the shifting signal WR_WL is inputted till a point of time that a second rising pulse of the sampled clock signal SPL_CLK is generated after the pulse of the shifting signal WR_WL is inputted. That is, the final clock signal FIN_CLK may be enabled to have a logic "high" level for a period between a point of time T33 and a point of time T34.

Subsequently, the data transmitter 8 may receive the first to fourth input data signals DIN<1:4> and may output the first to fourth input data signals DIN<1:4> as the first to fourth write input data signals WDIN<1:4> while the drive clock signal DRVCLK is enabled to have a logic "high" level. Further, the write driver 9 may receive the first to fourth write input data signals WDIN<1:4> to drive the signal levels on the first to fourth global lines WGIO<1:4> while the drive clock signal DRVCLK is enabled to have a logic "high" level. In such a case, the drive clock signal DRVCLK may be enabled during a period of 1.5 cycles of the internal clock signal ICLK from the point of time T34. That is, the drive clock signal DRVCLK may be enabled from the point of time T34 till a point of time T36. Thus, the signal levels on the first to fourth global lines WGIO<1:4> may be driven during a period of 1.5 cycles of the internal clock signal ICLK.

According to the embodiments set forth above, a data transmitter and a write driver may operate in synchronization with a drive clock signal. Thus, a data input circuit including the data transmitter and the write driver may operate even without use of any additional signals for controlling the data transmitter and the write driver. Accordingly, a layout area of the data input circuit can be reduced to improve the integration density of a semiconductor device employing the data input circuit. Further, a test operation may be provided to control a period that the drive clock signal is enabled. Thus, a driving time of global lines may be more readily controlled through the test operation.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A data input circuit comprising:
   a drive clock signal generator configured to shift and delay a final clock signal generated in response to a pulse of a sampled clock signal and configured to generate a drive clock signal in response to the delayed final clock signal;
   a data transmitter configured to output input data signals as write input data signals in response to the drive clock signal; and
   a write driver configured to receive the write input data signals in response to the drive clock signal to drive signals on global lines.

2. The data input circuit of claim 1, wherein the sampled clock signal is generated by sampling an internal clock signal during a burst length after a write latency elapses from a point of time that a write command signal is generated.

3. The data input circuit of claim 2, wherein the final clock signal is enabled and disabled in synchronization with sequential rising edges of the sampled clock signal after one cycle of the internal clock signal elapses from a point time that the write command signal is generated.

4. The data input circuit of claim 1, wherein an enabled duration of the drive clock signal is controlled in a test mode.

5. The data input circuit of claim 4, wherein the drive clock signal generator includes:
   a delay unit configured to sequentially shift the final clock signal to generate first to third delay signals;
   a selection transmitter configured to selectively output the third delay signal or a ground voltage signal as a control signal in response to a test signal; and
   a combinational logic unit configured to receive the second delay signal and the control signal to generate the drive clock signal.

6. The data input circuit of claim 5, wherein the delay unit is configured to shift the final clock signal by a predetermined duration to generate the first delay signal, configured to shift the first delay signal by the predetermined duration to generate the second delay signal, and configured to shift the second delay signal by the predetermined duration to generate the third delay signal.

7. The data input circuit of claim 6, wherein:
   the first delay signal is generated by a first delay signal generator which latches the final clock signal in synchronization with an internal clock signal;
   the second delay signal is generated by a second delay signal generator which latches the first delay signal in synchronization with an inverted signal of the internal clock signal; and
   the third delay signal is generated by a third delay signal generator which latches the second delay signal in synchronization with the internal clock signal.

8. The data input circuit of claim 7, wherein the second delay signal is created by shifting the first delay signal by half a cycle of the internal clock signal.

9. The data input circuit of claim 7, wherein the third delay signal is created by shifting the second delay signal by half a cycle of the internal clock signal.

10. The data input circuit of claim 7, wherein in the test mode, the drive clock signal is enabled for one and a half times the cycle of the internal clock signal.

11. The data input circuit of claim 6, wherein in the test mode, the third delay signal is transferred to become the control signal and the drive clock signal is enabled for three times the predetermined duration.

12. The data input circuit of claim 6, wherein out of the test mode, the ground voltage signal is transferred to become the control signal and the drive clock signal is enabled for twice the predetermined duration.

13. The data input circuit of claim 6, wherein the predetermined duration is set to half a cycle of an internal clock signal.

14. A data input circuit comprising:
   a data strobe signal sensing circuit configured to generate a shifting signal and a sampled clock signal in response to a write command signal, first to fourth write latency signals and burst signals, configured to generate a final clock signal in synchronization with the sampled clock signal, and configured to latch an internal strobe signal while the final clock signal is enabled to generate a write latch signal; and a drive clock signal generator configured to shift and delay the final clock signal and configured to generate a drive clock signal in response to the delayed final clock signal.

15. The data input circuit of claim 14, wherein the shifting signal includes a pulse which is occurred in synchronization with a point of time that a write latency elapses after the write command signal is generated.

16. The data input circuit of claim 15, wherein the sampled clock signal is generated by sampling an internal clock signal during a burst length after the write latency elapses from a point of time that the write command signal is generated.

17. The data input circuit of claim 16, wherein the final clock signal is enabled and disabled in synchronization with sequential rising edges of the sampled clock signal after the pulse of the shifting signal is inputted.

18. The data input circuit of claim 14, wherein the data strobe signal sensing circuit includes:
 a clock sampler configured to generate the shifting signal including a pulse which is occurred in synchronization with a point of time that a write latency elapses after the write command signal is generated and to generate the sampled clock signal which is obtained by sampling an internal clock signal during a burst length after the write latency elapses from a point of time that the write command signal is generated;
 a final clock generator configured to generate the final clock signal which is enabled and disabled in synchronization with sequential rising edges of the sampled clock signal after the pulse of the shifting signal is inputted; and
 a write latch signal generator configured to generate the write latch signal which is obtained by latching the internal strobe signal in response to the final clock signal.

19. The data input circuit of claim 18, wherein the clock sampler includes:
 a shifter configured to shift the write command signal in response to the write latency signal;
 a buffer configured to inversely buffer an output signal of the shifter;
 a section signal generator configured to generate a section signal which is enabled from a point of time that the write command signal is generated till a point of time which is set by the write latency signal and the burst signals;
 a driver configured to generate a drive signal in response to an output signal of the buffer and the section signal; and
 a transmitter configured to buffer and output the internal clock signal as the sampled clock signal in response to the drive signal.

20. The data input circuit of claim 18, wherein the final clock generator is configured to generate a first level signal whose level is changed in synchronization with a first rising edge of the sampled clock signal after the pulse of the shifting signal is inputted, configured to generate a second level signal whose level is changed in synchronization with a second rising edge of the sampled clock signal which is preceded by the first rising edge of the sampled clock signal, and configured to generate the final clock signal which is enabled from a point of time that a level transition of the first level signal occurs till a point of time that a level transition of the second level signal occurs.

21. The data input circuit of claim 14, wherein an enabled duration of the drive clock signal is controlled in a test mode.

22. The data input circuit of claim 21, wherein the drive clock signal generator includes:
 a delay unit configured to sequentially shift the final clock signal to generate first to third delay signals;
 a selection transmitter configured to selectively output the third delay signal or a ground voltage signal as a control signal in response to a test signal; and
 a combinational logic unit configured to receive the second delay signal and the control signal to generate the drive clock signal.

23. The data input circuit of claim 22, wherein the delay unit is configured to shift the final clock signal by a predetermined duration to generate the first delay signal, configured to shift the first delay signal by the predetermined duration to generate the second delay signal, and configured to shift the second delay signal by the predetermined duration to generate the third delay signal.

24. The data input circuit of claim 23, wherein in the test mode, the third delay signal is transferred to become the control signal and the drive clock signal is enabled for three times the predetermined duration.

25. The data input circuit of claim 23, wherein out of the test mode, the ground voltage signal is transferred to become the control signal and the drive clock signal is enabled for twice the predetermined duration.

26. The data input circuit of claim 23, wherein the predetermined duration is set to half a cycle of an internal clock signal.

27. The data input circuit of claim 14, further comprising:
 a data transmitter configured to output input data signals as write input data signals in response to the drive clock signal; and
 a write driver configured to receive the write input data signals in response to the drive clock signal to drive signals on global lines.

28. The data input circuit of claim 27, further comprising a data latch portion configured to latch data which are arranged in synchronization with the write latch signal to output the input data signals.

* * * * *